United States Patent
Dubeyko et al.

(10) Patent No.: US 10,067,683 B2
(45) Date of Patent: Sep. 4, 2018

(54) SYSTEMS AND METHODS FOR CLASSIFYING DATA IN SOLID STATE DRIVES

(71) Applicant: Western Digital Technologies, Inc., Irvine, CA (US)

(72) Inventors: Viacheslav Dubeyko, San Jose, CA (US); Chao Sun, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 107 days.

(21) Appl. No.: 15/214,185

(22) Filed: Jul. 19, 2016

(65) Prior Publication Data

US 2018/0024737 A1    Jan. 25, 2018

(51) Int. Cl.
| | |
|---|---|
| G06F 12/00 | (2006.01) |
| G06F 13/00 | (2006.01) |
| G06F 13/28 | (2006.01) |
| G06F 3/06 | (2006.01) |
| G11C 16/10 | (2006.01) |
| G11C 16/26 | (2006.01) |

(52) U.S. Cl.
CPC ............ *G06F 3/061* (2013.01); *G06F 3/0655* (2013.01); *G06F 3/0688* (2013.01); *G11C 16/10* (2013.01); *G11C 16/26* (2013.01)

(58) Field of Classification Search
CPC ...... G06F 3/061; G06F 3/0655; G06F 3/0688; G11C 16/10; G11C 16/26
USPC ........................................................ 711/102
See application file for complete search history.

(56) References Cited

U.S. PATENT DOCUMENTS

| | | | |
|---|---|---|---|
| 8,078,794 B2 | 12/2011 | Lee et al. | |
| 8,239,639 B2* | 8/2012 | Sinclair | G06F 12/0246 707/824 |
| 9,134,917 B2* | 9/2015 | Kimmel | G06F 3/061 |
| 2005/0251617 A1* | 11/2005 | Sinclair | G06F 3/061 711/103 |
| 2009/0164536 A1* | 6/2009 | Nasre | G06F 3/0611 |
| 2010/0088459 A1* | 4/2010 | Arya | G06F 3/061 711/103 |
| 2015/0106556 A1* | 4/2015 | Yu | G11C 16/349 711/103 |

OTHER PUBLICATIONS

Liu, et al.; MOLAR: A Cost-Efficient, High-Performance SSD-Based Hybrid Storage Cache; Oxford Journals; Science & Mathematics; Computer Journal; vol. 58, Issue 9; dated Oct. 16, 2013; 2 total pages.

(Continued)

*Primary Examiner* — Sheng-Jen Tsai
(74) *Attorney, Agent, or Firm* — Patterson & Sheridan, LLP; Steven Versteeg (57) ABSTRACT

Systems and methods for writing data to a storage are disclosed. The disclosed systems and methods can receive, by a target device in communication with a host, a first write request from the host to write first data to the storage in communication with the target device. The disclosed systems and methods can determine, by a storage controller in the target device, a data type of the first data based on a first flag set corresponding to the first data. The disclosed systems and methods can store the first data to a location in the storage based at least on the data type of the first data.

19 Claims, 7 Drawing Sheets

300

| | FLAGS | | | | |
|---|---|---|---|---|---|
| | Data Type | Read-intensive | Write-intensive | Update-intensive | Description |
| 301 → | 0 | 1 | 0 | 0 | Metadata: Read-intensive 203 |
| 302 → | 0 | 0 | 1 | 0 | Metadata: Write-intensive 204 |
| 303 → | 0 | 0 | 0 | 1 | Metadata: Update-intensive 205 |
| 304 → | 1 | 0 | 0 | 0 | User data: "Cold" data 207 |
| 305 → | 1 | 1 | 0 | 0 | User data: "One writer, many readers" 208 |
| 306 → | 1 | 0 | 1 | 0 | User data: "Many writers, one reader" 209 |
| 307 → | 1 | 0 | 0 | 1 | User data: Update-intensive 210 |

(56) References Cited

OTHER PUBLICATIONS

Xu, et al.; NOVA: A Log-Structured File System for Hybrid Volatile/Non-Volatile Main Memories; date unknown; 16 total pages.
Soundararajan, et al.; Extending SSD Lifetimes With Disk-Based Write Caches; date unknown; 14 total pages.

* cited by examiner

| | FLAGS | | | Description |
|---|---|---|---|---|
| Data Type | Read-intensive | Write-intensive | Update-intensive | |
| 0 | 1 | 0 | 0 | Metadata: Read-intensive 203 |
| 0 | 0 | 1 | 0 | Metadata: Write-intensive 204 |
| 0 | 0 | 0 | 1 | Metadata: Update-intensive 205 |
| 1 | 0 | 0 | 0 | User data: "Cold" data 207 |
| 1 | 1 | 0 | 0 | User data: "One writer, many readers" 208 |
| 1 | 0 | 1 | 0 | User data: "Many writers, one reader" 209 |
| 1 | 0 | 0 | 1 | User data: Update-intensive 210 |

SYSTEMS AND METHODS FOR CLASSIFYING DATA IN SOLID STATE DRIVES

FIELD OF THE DISCLOSURE

The present disclosure relates to systems and methods for classifying data for efficient storage in solid state drives (SSDs), and more specifically to systems and methods for classifying data based on information in the file system about the data and using that information for efficient data storage in SSDs.

BACKGROUND

An SSD storage controller manages both stored data and data to be stored in SSD storage, such as non-volatile memory, and can process read/write requests from a host computer. The host computer can issue read and write commands to the SSD storage controller to read data from or write data to the SSD storage. Knowledge about the type of data to be stored in the SSD storage can help the SSD controller improve the lifetime and the performance of the SSD storage. For example, by storing frequently-updated data in the same erase block in NAND flash and separately from infrequently-updated data, overhead associated with write amplification and garbage collection in the SSD device can be reduced. Therefore, it is desirable for SSD controllers to classify the data based on their characteristics, e.g., frequency of updates. After characterizing the data, the SSD storage controller can store the data with similar characteristics in the same erase block.

Prior art methods for classifying data utilize only limited information about the data. Based on this limited information, the SSD storage controller cannot accurately determine various characteristics of data, including data type and data activity. A file system driver implemented in a host computer can have information about the data to be stored in the SSD storage, but such information is not utilized by the storage controller in prior art methods.

SUMMARY

Systems and methods for writing data to a storage are provided. According to aspects of the present disclosure, a method for writing data to a storage can include receiving, by a target device in communication with a host, a first write request from the host to write first data to the storage in communication with the target device. The method can also include determining, by a storage controller in the target device, a data type of the first data based on a first flag set corresponding to the first data. The method can also include storing the first data to a location in the storage based at least on the data type of the first data.

According to some embodiments, storing the first data to a location can include storing the first data to a first location in the storage when the data type of the first data corresponds to a first data type; and storing the first data to a second location in the storage when the data type of the first data corresponds to a second data type.

According to some embodiments, the first data type can correspond to user data and the second data type can correspond to metadata.

According to some embodiments, the storage can include a plurality of non-volatile memories, the first location can be in a first non-volatile memory (NVM) in the storage, and the second location can be in a second NVM in the storage.

According to some embodiments, the first NVM can include a NAND flash memory and the second NVM can include at least one of a phase-change memory (PCM), a magnetoresistive RAM (MRAM) and a resistive RAM (RRAM or ReRAM).

According to some embodiments, the first flag set can include at least one flag bit, and the at least one flag bit can indicate at least one characteristic of the first data based on information from a file system operating on the host.

According to some embodiments, the first flag set can include a first flag bit that indicates the data type of the first data; a second flag bit that indicates whether the first data is read-intensive; a third flag bit that indicates whether the first data is write-intensive; and a fourth flag bit that indicates whether the first data is update-intensive.

According to some embodiments, the storing the first data to a location in the storage can be further based at least on the second flag bit of the first flag set, the third flag bit of the first flag set, and the fourth flag bit of the first flag set.

According to some embodiments, the method can further include moving the first data to a second location in the storage; and retrieving the first data from the second location in response to a first read request from the host.

According to some embodiments, the second location in the storage can be selected based at least on characteristics of the first data.

According to aspects of the present disclosure, a system for writing data to a storage can include a target device in communication with a host configured to receive a first write request from the host to write first data to the storage. The target device can include a storage controller configured to determine a data type of the first data based on a first flag set corresponding to the first data, and store the first data to a location in the storage based at least on the data type of the first data.

According to some embodiments, the storage controller can be configured to store the first data to a location by storing the first data to a first location in the storage when the data type of the first data corresponds to a first data type; and storing the first data to a second location in the storage when the data type of the first data corresponds to a second data type.

According to some embodiments, the first data type can correspond to user data and the second data type can correspond to metadata.

According to some embodiments, the storage can include a plurality of non-volatile memories, the first location can be in a first non-volatile memory (NVM) in the storage, and the second location can be in a second NVM in the storage.

According to some embodiments, the storage controller can be further configured to store the first data to a location by storing the first data to a third location in the storage when the data type of the first data corresponds to a third data type, and the third location can be in a third NVM in the storage.

According to some embodiments, the first NVM can include a NAND flash memory, and the second NVM can include at least one of a phase-change memory (PCM), a magnetoresistive RAM (MRAM) and a resistive RAM (RRAM or ReRAM).

According to some embodiments, the first flag set can include at least one flag bit, and the at least one flag bit can indicate at least one characteristic of the first data based on information from a file system operating on the host.

According to some embodiments, the first flag set can include a first flag bit that indicates the data type of the first data; a second flag bit that indicates whether the first data is read-intensive; a third flag bit that indicates whether the first data is write-intensive; and a fourth flag bit that indicates whether the first data is update-intensive.

According to some embodiments, the storing the first data to a location in the storage can be further based at least on the second flag bit of the first flag set, the third flag bit of the first flag set, and the fourth flag bit of the first flag set.

According to some embodiments, the target device can be further configured to move the first data to a second location in the storage and retrieve the first data from the second location in response to a first read request from the host.

According to some embodiments, the second location in the storage can be selected based at least on characteristics of the first data.

These and other embodiments will be described in greater detail in the remainder of the specification referring to the drawings.

BRIEF DESCRIPTION OF THE DRAWINGS

Various objects, features, and advantages of the present disclosure can be more fully appreciated with reference to the following detailed description when considered in connection with the following drawings, in which like reference numerals identify like elements. The following drawings are for the purpose of illustration only and are not intended to be limiting. The scope of the invention is set forth in the claims that follow.

DETAILED DESCRIPTION

Figure 1:
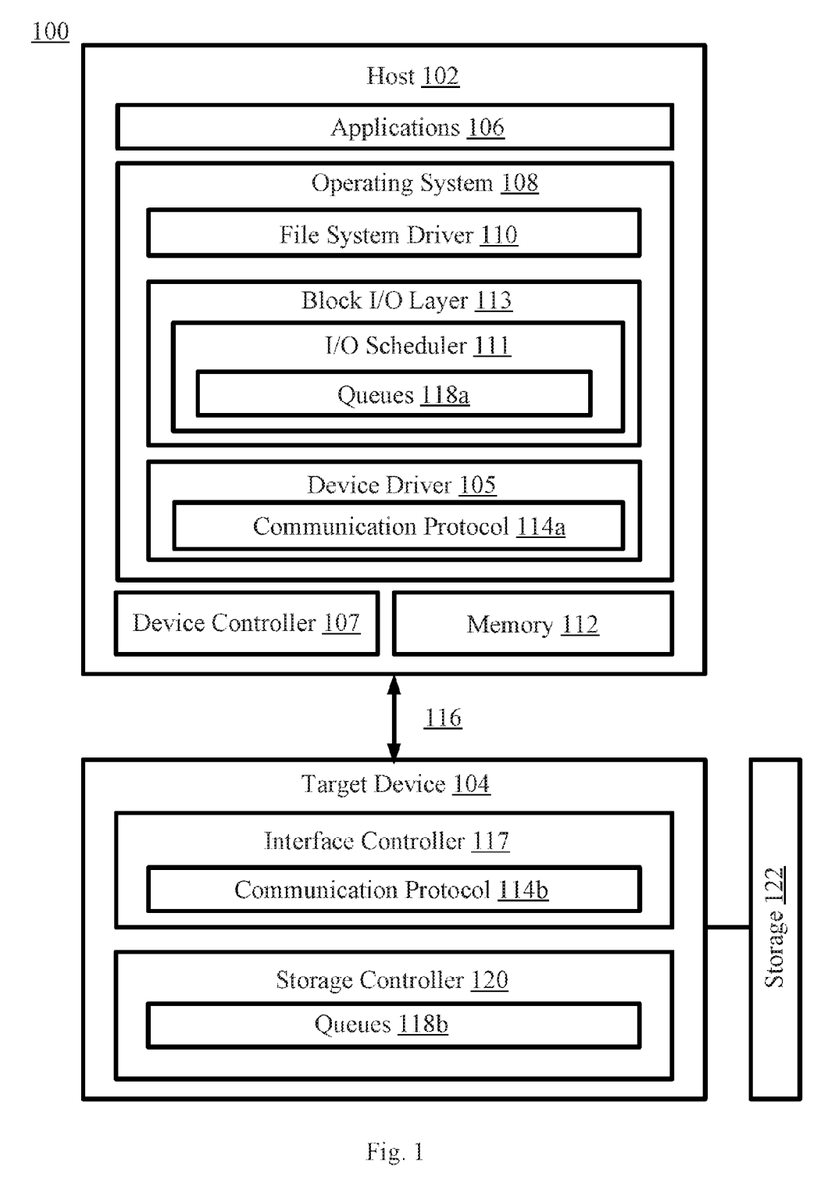
FIG. 1 illustrates an exemplary system, in accordance with embodiments of the present disclosure.

FIG. 1 illustrates an exemplary system 100, in accordance with embodiments of the present disclosure. System 100 can include host 102 in communication 116 with target device 104 and storage 122. Host 102 can include applications 106, operating system 108, device controller 107, and host memory 112. Operating system 108 can include file system driver 110, block I/O layer 113, which can include I/O scheduler 111 and queues 118a, and device driver 105, which can include communication protocol 114a. Target device 104 can include interface controller 117, which includes communication protocol 114b, and storage controller 120, which includes queues 118b. Target device 104 also is in communication with storage 122. Various components that are part of system 100 can be implemented as hardware, software, or combinations of both. For example, host memory 112 can be electronic hardware and/or software-implemented virtual memory. Moreover, these various components can be arranged in different ways. For example, although applications 106 are shown in a box separate from operating system 108, some or all of applications 106 can be part of operating system 108, according to some embodiments. As another example, although queues 118a are shown as part of operating system 108, some or all of the queues can be implemented outside operating system 108. Furthermore, system 100 can include only some of these components and can also include other components not shown in FIG. 1.

Host 102 can run applications 106, for example, user-level applications, on operating system 108. According to some embodiments, operating system 108 can include user-level applications 106, which can be run as part of operating system 108. According to embodiments of the present disclosure, file system driver 110 can be a part of operating system 108. File system driver 110 can organize, manage, monitor, and/or control data in host 102. File system driver 110 can provide functionality related to storing data to, and retrieving data from, storage 122. File system driver 110 can also provide functionality to applications 106 to perform data storage and retrieval. File system driver 110 can have a large amount of information about the data in the host. The information can include, for example, information about the data type, e.g., whether the data is metadata or user data, and data activity, e.g., how frequently the data is used or accessed by an application running on the host. File system driver 110 can interact with block I/O layer 113, which can be part of operating system 108. Block I/O layer 113 can include I/O scheduler 111, which can in turn include queues 118a. Write and read request instructions can be enqueued at queues 118a before being scheduled to be sent to target device 104 by I/O scheduler 111. Device driver 105 can implement communication protocol 114a for communicating with target device 104 over interface 116 via device controller 107. According to some embodiments, operating system 108 can contain one or more device drivers 105 that can implement different types of communication protocols 114a for interacting with different target devices 104. According to some embodiments, device driver 105 can be implemented as software that communicates with device controller 107, which can be implemented as hardware. Device driver 105 can control one or more devices, such as target device 104, via device controller 107. Device controller 107 can control one or more devices by sending and receiving electric signals to and from the one or more devices, such as target device 104.

Methods and data of operating system 108 and applications 106 can be loaded in host memory 112. According to embodiments of the present disclosure, memory 112 can be dynamic random access memory (DRAM). Queues 118a can also be loaded in host memory 112 to store commands from host 102 for target device 104 to process. Examples of stored or enqueued commands can include read and write operations directed to storage 122. Storage controller 120 can process these read and write commands to retrieve and store data. Host 102 can use communication protocol 114a to communicate over interface 116 with target device 104 using interface controller 117. Examples of interface 116 include Peripheral Component Interconnect Express (PCIe), Serial Advanced Technology Attachment (SATA), Small Computer System Interface (SCSI), Non-Volatile Memory Express (NVMe), and Serial Attached SCSI (SAS).

According to embodiments of the present disclosure, a solid state drive (SSD) is an example of a storage system that can include target device 104 and storage 122. Host 102 can send write and read request instructions to target device 104 with information about the data. An SSD storage controller, e.g., storage controller 120, can analyze and use the received information about the data to classify the data.

Target device 104 can communicate with host 102 using interface controller 117, which can implement communication protocol 114b. Target device 104 can place received write request instructions in queues 118b. Storage controller 120 can include queues 118b, and retrieve the write request instructions from queues 118b to process them. Target device 104 can implement the disclosed methods described herein.

As discussed above, prior art methods for classifying data for storage by the SSD storage controller do not utilize information about the data from the file system. Some methods include logical block addressing (LBA) clustering algorithms, Two-level Least Recently Used (LRU) Lists, Multiple Bloom Filters, and Dynamic Data Clustering. The LBA clustering algorithms can be used to monitor LBA history, such as LBA statistics.

All of these prior art methods have drawbacks: the mis-predication rate can be high because the storage system cannot differentiate between metadata and user data, and the limited information about the data arriving at the storage device is not sufficient to predict data activity. The present disclosure overcomes these issues by classifying data at the host, e.g., by file system driver, and transmitting information related to the classification of the data from the host to the storage device. Based on this information, storage controller 120 can set and/or use a policy to write data to storage 122.

Figure 2:
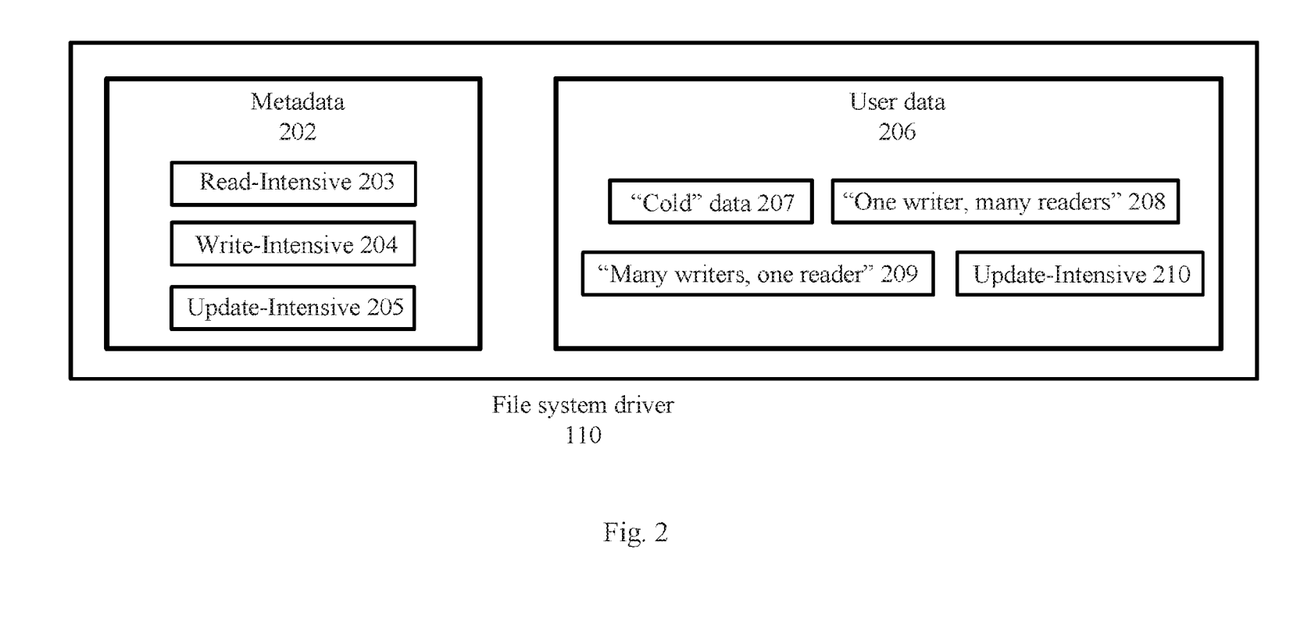
FIG. 2 illustrates an exemplary data classification scheme, in accordance with embodiments of the present disclosure.

FIG. 2 illustrates an exemplary data classification scheme, in accordance with embodiments of the present disclosure. File system driver 110 can classify data into one of two principal types, for example, metadata 202 and user data 206. Metadata 202 can fall into one or more subtypes, for example, read-intensive 203, write-intensive 204, and update-intensive 205.

According to some embodiments of the present disclosure, metadata 202 can be read-intensive 203 if the storage system receives a large number of read requests for the LBA(s) associated with metadata 202. In other embodiments, metadata 202 can be read-intensive 203 if the storage system is expected or forecast to receive a large number of read requests for the LBA(s) associated with metadata 202. A number of read requests can be large if it exceeds a pre-defined or dynamically-defined threshold number. The pre-defined or dynamically-defined threshold number can be an absolute or relative number.

According to some embodiments of the present disclosure, metadata 202 can be write-intensive 204, if the file(s) associated with metadata 202 is growing intensively such that metadata 202 is also growing intensively. The file(s) can grow in terms of size and/or number. For example, metadata can be a folder, which describes files contained in the folder. These files' descriptors can be located across one or more file system volume's blocks. When the number of new files created in the folder is growing, the metadata structure, which is used to represent the folder's content, is updated by adding these newly-created files' descriptors. This results in the number of file system volume's blocks, which the folder owns, to grow. In this case, the metadata can be said to be write-intensive 204.

According to embodiments, metadata 202 can be update-intensive 205 if the storage system receives a large number of write requests for the same LBA(s) associated with metadata 202. This can result in the new content of the LBA(s) to be stored in a new physical location(s), such as a new NAND flash page(s). In other embodiments, metadata 202 can be update-intensive 205 if the storage system is expected or forecast to receive a large number of write requests for the same LBA(s) associated with metadata 202.

According to embodiments, a number of write requests for the same LBA(s) associated with metadata 202 can be large if it exceeds a pre-defined or dynamically-defined threshold number. The pre-defined or dynamically-defined threshold number can be an absolute or relative number.

According to embodiments, metadata 202 can either be write-intensive 204 or update-intensive 205, when these two subtypes are mutually exclusive.

According to embodiments, metadata 202 can be classified into read-intensive 203, write-intensive 204, or update-intensive 205 based on the architecture of the file system, qualitative nature of data, and/or statistical analysis. This classification can be performed with or without taking into account the threshold numbers discussed above. For example, if the file system is a journaling file system that uses a journal as a structure for metadata 202, metadata 202 can be classified as read-intensive 203 and write-intensive 204. The journal can be implemented as a circular buffer, which can be used to write journal transactions to the tail and read journal transactions from the head. As another example, the file system can utilize an inode table as a structure for metadata 202, where metadata 202 can be classified as read-intensive 203 and update-intensive 205. The inode table can have a fixed size, and can generally receive a large number of read and update requests. According to some embodiments, an extents tree is a type of metadata 202. The extents tree can describe the placement of another type of metadata (e.g. content of a folder) and/or the placement of user data (e.g. a file) on a file system volume. The extents tree can be classified into read-intensive 203, write-intensive 204, or update-intensive 205 based on the nature of the file it describes. For instance, if the extents tree describes a video, archive, or picture file, the extents tree can be classified as neither read-intensive 203 nor write-intensive 204 nor update-intensive 205. On the other hand, if the extents tree describes a WINDOWS™ registry file, the extents tree can be classified as read-intensive 203. According to some embodiments, file system driver 110 can collect file operation history and perform statistical analysis. For example, if an LBA range is associated with metadata 202 and read requests from a certain volume area that is represented by the LBA range are received in a large number, metadata 202 can be classified as read-intensive 203.

User data 206 can fall into one or more of the subtypes, for example, "cold" data 207, "one writer, many readers" 208, "many writers, one reader" 209, and "update-intensive" 210.

According to an illustrative example shown in FIG. 2, user data 206 can be "cold" data 207 if user data 206 is neither read-intensive nor write-intensive nor update-intensive. Archived data can be an example of "cold" data 207. According to the example shown in FIG. 2, user data 206 can be "one writer, many readers" 208 if user data 206 is read-intensive but neither write-intensive nor update-intensive. According to some embodiments, when a system contains a small number of write thread(s) and a large number of read threads (e.g. one or several write thread(s) and tens, hundreds, thousands, or more read threads), user data 206 can be "one writer, many readers" 208. In this case, the user data 206 file(s) can grow because of the activity by the write thread(s). According to the example shown in FIG. 2, user data 206 can be "many writers, one reader" 209 if user data 206 is write-intensive but neither read-intensive nor update-intensive. According to some embodiments, when a system contains a small number of read thread(s) and a large number of write threads (e.g. one or several read thread(s) and tens, hundreds, thousands, or more write threads), user data 206 can be "many writers, one reader" 209. In this case, read and write requests can be issued simultaneously.

According to embodiments, user data 206 can be read-intensive if the storage system receives a large number of read requests for the LBA(s) associated with user data 206. In other embodiments, user data 206 can be read-intensive if the storage system is expected or forecast to receive a large number of read requests for the LBA(s) associated with user data 206. A number of read requests can be large if it exceeds a pre-defined or dynamically-defined threshold number. The pre-defined or dynamically-defined threshold number can be an absolute or relative number.

According to some embodiments, user data 206 can be write-intensive, if the user data 206 file(s) is growing intensively. In these embodiments, the LBA(s) associated with the file(s) can change in each write request for the file(s). This can result in the storage system using a different block(s) for each write request.

According to some embodiments, user data 206 can be update-intensive 210, if the user data 206 file(s) is updated frequently. In these embodiments, many write requests for user data 206 are for the same LBA(s) associated with the file(s). This can result in the storage system using the same logical block(s) as addressed by LBA(s) but a different physical page(s) for each write request. According to embodiments, the user data 206 file(s) is updated frequently if the number of write requests with the same LBA(s) associated with the file(s) exceeds a pre-defined or dynamically-defined threshold number. The pre-defined or dynamically-defined threshold number can be an absolute or relative number. In other embodiments, user data 206 can be update-intensive 210 if the storage system is expected or forecast to receive a large number of write requests for the same LBA(s) associated with user data 206.

According to embodiments, user data 206 can be classified into "cold" data 207, "one writer, many readers" 208, "many writers, one reader" 209, or update-intensive 210 based on the architecture of the file system, qualitative nature of data, and/or statistical analysis, similar to the metadata classification described above. This classification for user data 206 can also be performed with or without taking into account the threshold numbers discussed above. For example, if user data 206 is in a temporary file(s), user data 206 can be classified as read-intensive, write-intensive, and/or update-intensive 210. Temporary files can be small files with a short lifetime and updated frequently. As another example, if user data 206 is in a video, archive, or picture file(s), user data 206 can be classified as "cold" data 207. Yet, in another example, if user data 206 is part of a word processing document, user data 206 can be classified as update-intensive 210 and/or write-intensive. According to some embodiments, the file system can collect file operation history, and perform statistical analysis based on the number of read and write requests. The statistical analysis can show distributions based on the frequency of read and write requests. According to some embodiments, the threshold numbers discussed above can be calculated based on the statistical analysis.

A person of ordinary skill would understand that the two principal types and seven subtypes in file system driver110 of FIG. 2 are presented for illustrative purposes only. Some or all of these types and subtypes can be modified or removed. Other types and subtypes can also be defined and used in a file system.

Figure 3:
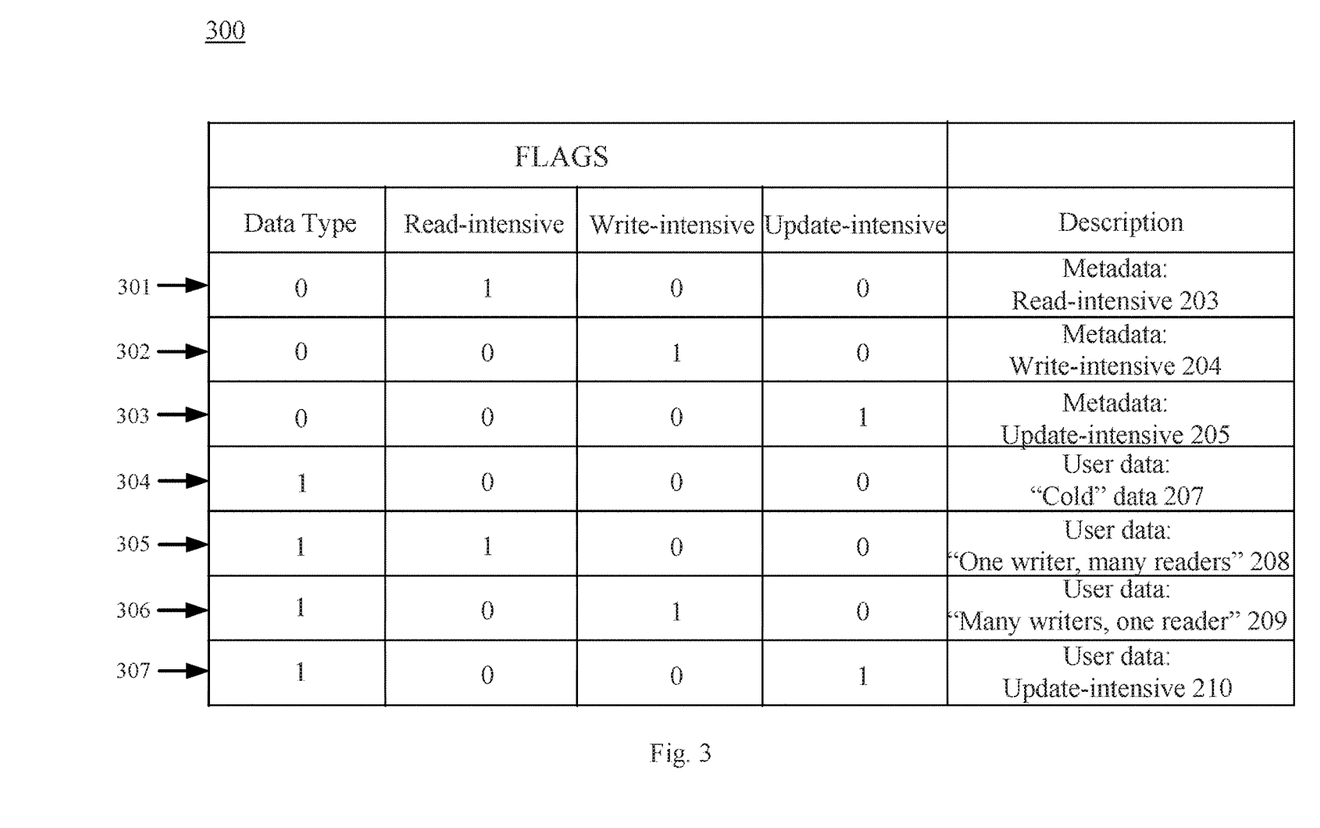
FIG. 3 illustrates an exemplary set of flags based on the data classification scheme in FIG. 2, in accordance with embodiments of the present disclosure.

FIG. 3 illustrates an exemplary set of flags 300 based on the data classification scheme in FIG. 2, in accordance with embodiments of the present disclosure. According to embodiments, host 102 (FIG. 1) can send the flags to target device 104. A flag can be used to provide information about data. For example, the seven subtypes (203-205 and 207-210) described in FIG. 2 can be represented using the set of flags 300, which are labelled as "Data Type," "Read-intensive," "Write-intensive," and "Update-intensive." For example, each flag can have a bit of information as follows. The "Data Type" flag can be set to "0" or "1" to respectively indicate that the data is metadata or user data. The "Read-intensive" flag can be set to "1" to indicate that the data is read-intensive; otherwise, it can be set to "0." The "Write-intensive" flag can be set to "1" to indicate that the data is write-intensive; otherwise, it can be set to "0." The "Update-intensive" flag can be set to "1" to indicate that the data is update-intensive; otherwise, it can be set to "0." Exemplary values of the four flags that correspond to the example of FIG. 2 are shown at 301, 302, 303, 304, 305, 306, and 307. As an example, for read-intensive metadata 203, the "Data Type," "Read-intensive," "Write-intensive," and "Update-intensive" flags can be set to "0," "1," "0," and "0," respectively. The flags can be grouped together to represent a four-bit number.

A person of ordinary skill would understand that the set of flags 300 in FIG. 3 is presented for illustrative purposes only. Other numbering systems for flags can be implemented for the same data classification scheme, or for any other data classification schemes. For example, a flag can include other attributes related to the current workload activity at the host, access control information about the data, and priority levels for storing the data. Thus, flags can provide information about data that is not present in the storage system.

Figure 4:
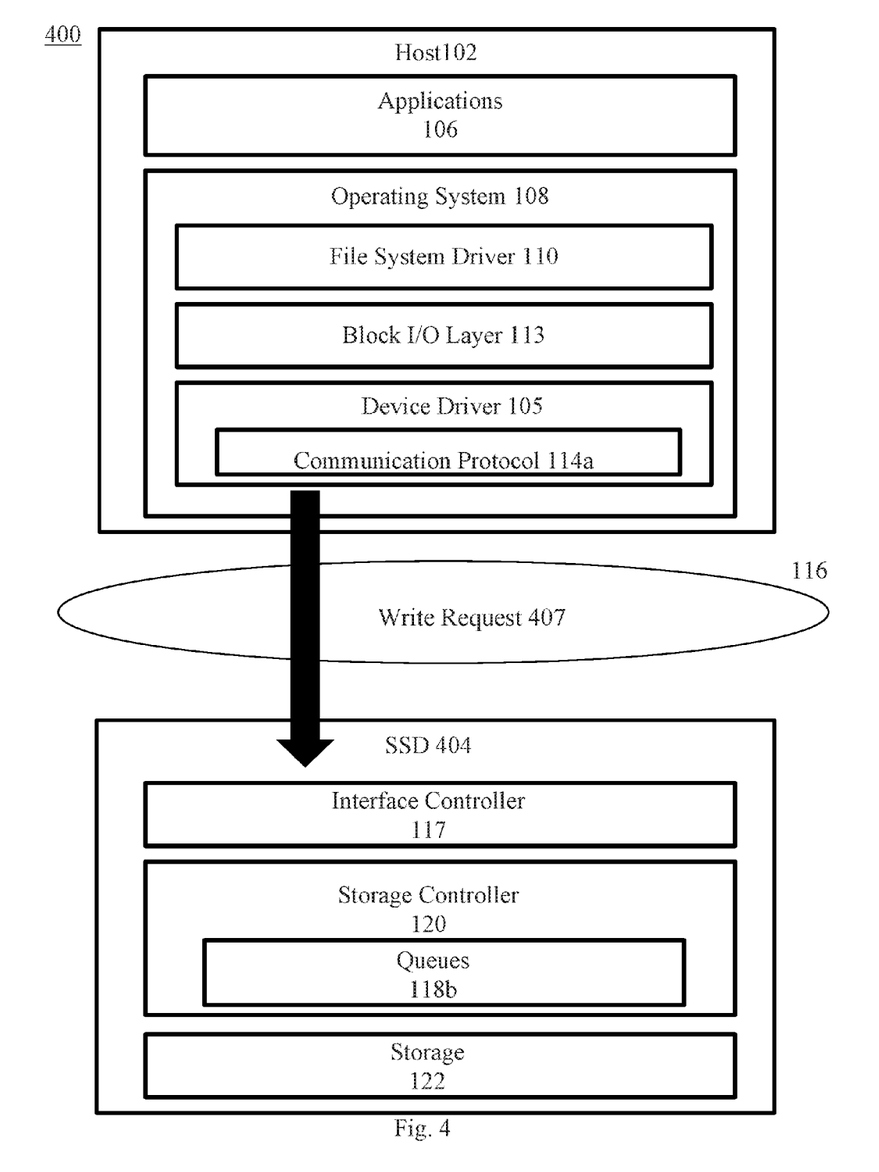
FIG. 4 illustrates an exemplary system with an SSD, in accordance with embodiments of the present disclosure.

FIG. 4 illustrates an exemplary system 400 with an SSD system, in accordance with embodiments of the present disclosure. In some embodiments, system 400 can be based on system 100 of FIG. 1. System 400 can include host system 102 and SSD system 404. Host 102 can include applications 106, operating system 108, file system driver 110, block I/O layer 113, device driver 105, and communication protocol 114a. SSD system 404 can include interface controller 117, storage controller 120, queues 118b, and storage 122. System 400 can also include other modules, such as one or more modules that are described in connection with FIG. 1 but are not shown in FIG. 4.

When file system driver 110 receives write requests from applications 106 or operating system 108, file system driver 110 can initiate write requests to block I/O layer 113. Block I/O layer 113 can create a packet(s) of communication protocol 114a based on the write requests. Using these packet(s), host 102 can transmit the write requests 407 to SSD system 404 via interface 116. For example, a write request 407 from host system 102 to SSD system 404 can include different portions, such as an instruction (e.g. a write command), one or more LBA numbers, a number indicating the length of data requested to be written, the data to be written into SSD 404, and one or more flags associated with the data.

According to embodiments, storage controller 120 can receive and process the contents of write request 407. For example, storage controller 120 can read, parse, and/or interpret the contents of write request 407. For example, storage controller 120 can parse out the flag set portion of write request 407. According to some embodiments, storage controller 120 can execute the instruction based on the value(s) in the flag set. For example, storage controller 120 can write the data at a specific physical location in storage 122, based on the data being read-intensive, write-intensive, and/or update-intensive, as indicated in the flag. According to some embodiments, if storage 122 is a hybrid storage system, e.g., including more than one memory types, storage controller 120 can also determine which memory type to store the data into, based on the flag. Additional details are discussed below in connection with FIG. 6 below, which describes a hybrid SSD storage system.

According to some embodiments, interface controller 117 can receive the packet(s) containing write request 407 from host 102, check validity of the packet(s), and enqueue write request 407 in queues 118b. Storage controller 120 can receive a request from queues 118b to process write request 407. Storage controller 120 can process write request 407.

Figure 5:
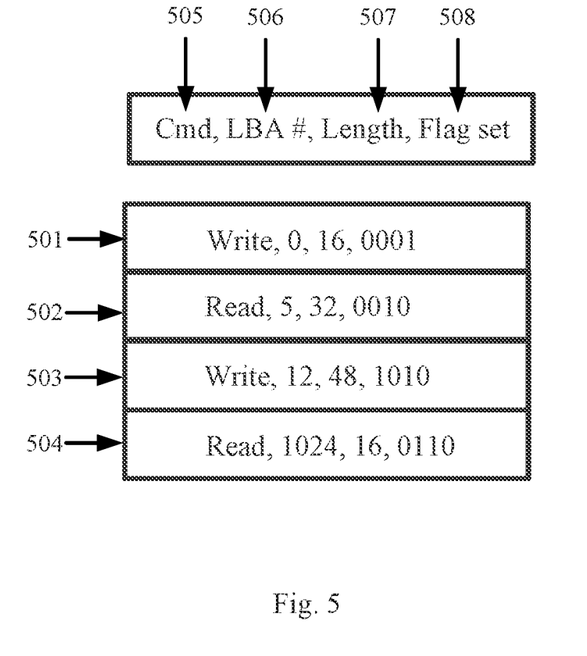
FIG. 5 illustrates an exemplary set of host instructions in a target device, in accordance with embodiments of the present disclosure.

FIG. 5 provides exemplary host commands or instructions 501-504, according to embodiments of the disclosure. As illustrated in FIG. 5, each instruction can include four elements, for example, the type of command 505, the LBA number 506, the length 507, and the flag set 508. Command 503, for example, can represent an instruction to write data to storage 122 (FIG. 1). The particular instruction further specifies that the data has an LBA number of 12 and length of 48, e.g., storage units, such as bytes, packets, blocks, and lines. Assuming for exemplary purposes the flag scheme of FIG. 3, the flag set of command 503, "1010" matches flag set 306 (FIG. 3), which corresponds to user data with the "many writers, one reader" subtype.

According to embodiments, target device 104 (FIG. 1) can execute the received commands from the host sequentially. For example, the received commands can be executed by the storage controller based on a first in, first out mechanism. According to alternative embodiments, target device 104 (FIG. 1) can execute the received commands based on the contents of the instructions. For example, the commands can be executed according to the corresponding flags in each commands. According to alternative embodiments, the received commands can be executed by the storage controller based on the length information in each received command. According to alternative embodiments, the received commands can be executed by the storage controller based on the LBA number in each received command.

Figure 6:
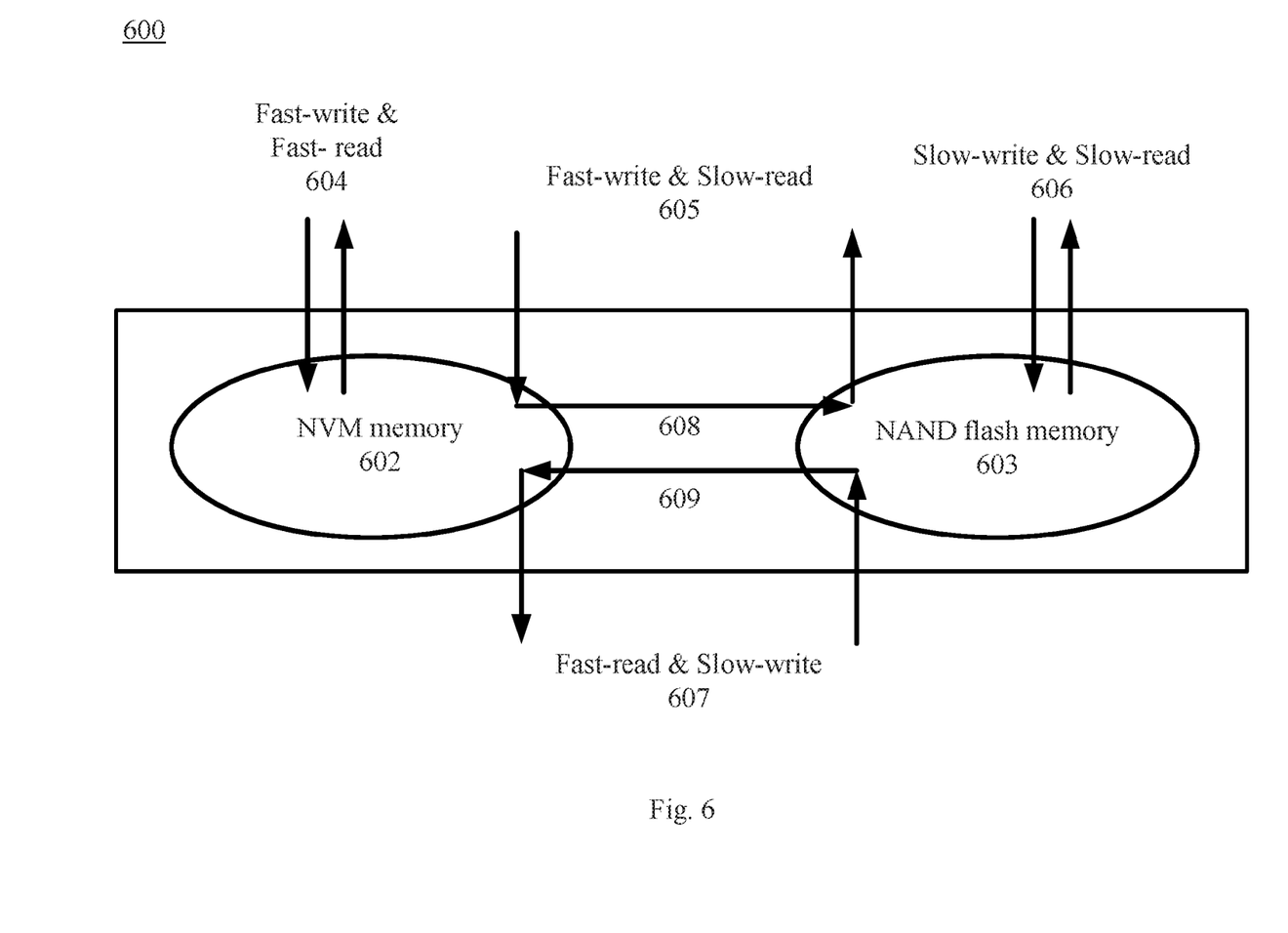
FIG. 6 illustrates an exemplary system of a hybrid SSD, in accordance with embodiments of the present disclosure.

FIG. 6 illustrates an exemplary hybrid SSD device 600, in accordance with embodiments of the present disclosure. Hybrid SSD device 600 can include NVM memory 602 and NAND flash memory 603. NVM memory 602 can be of a different type than NAND flash memory. Types of non-volatile memories, other than NAND flash, can include phase-change memory (PCM), magnetoresistive RAM (MRAM) and resistive RAM (RRAM or ReRAM). Types of non-volatile memories, other than NAND flash, can further include any future generation of NVM memory types. NVM memory 602 can provide fast-write and fast-read access 604 to data. NVM memory 602 can be byte-addressable, and can also provide better endurance than NAND flash memory 603. Compared to NVM memory 602, NAND flash memory 603 can provide slow-write and slow-read access 606 to data. Within hybrid SSD system 600, data can move (608) from NVM memory 602 to NAND flash memory 603. Hybrid SSD system 600 can provide fast-write and slow-read access 605 to data by: (1) writing data to NVM memory 602, (2) moving the data to NAND flash memory 603, and (3) reading the data from NAND flash memory 603. Within hybrid SSD system 600, data can also move (609) from NAND flash memory 603 to NVM memory 602. Hybrid SSD system 600 can provide fast-read and slow-write access 607 to data by: (1) writing data to NAND flash memory 603, (2) moving the data to NVM memory 602, and (3) reading the data from NVM memory 602.

According to embodiments of the present disclosure, hybrid SSD device 600 can take into account data characteristics to distribute data between NVM memory 602 and NAND flash memory 603. According to embodiments, the storage controller of hybrid SSD device 600 can be configured using hardware and/or software to analyze the information in the flags of instructions or commands received from the host and distribute the received data within the hybrid SSD device 600 according to specific rules. According to embodiments, the rules can depend on one or more factors, including for example, the current or expected workload of the host system, the size of the NVM memory, the size of the NAND flash memory, the size of the free space in the NVM memory, the size of the free space in the NAND flash memory, the performance difference between the NVM memory and the NAND flash memory, the expected amount of incoming data, the expected amount of data removal, instructions from the host, and instructions implemented within the hybrid SSD system.

For example, the "cold" user data 207, shown in FIG. 2, can be stored in NAND flash memory 603 because such data will not be accessed frequently. The overall system performance can be improved by storing data that will be accessed frequently in NVM memory 602, because it can provide fast-read and fast-write access 604. For example, the update-intensive user data 210 and the write-intensive user data, shown in FIG. 2, can be stored in NVM memory 602 because such data will be written frequently.

Read-intensive user data that is written rarely (e.g. the "one writer, many readers" user data 208 shown in FIG. 2) can have fast-read and slow-write access 607. The user data can be written to NAND flash memory 603 first and then moved to NVM memory 602. According to embodiments, the user data can be moved to NVM memory 602 during the first read. In other embodiments, the user data can be moved at another time, such as when hybrid SSD device 600 is moderately or not busy or when NVM memory 602 has sufficient free space. In yet other embodiments, the user data can be written directly to NVM memory 602. According to some embodiments, the SSD controller can be configured to check queues 118b (FIG. 1). If both read and write requests for the same LBA number exist in queues 118b (FIG. 1), then the user data, represented by the LBA number, can be configured to write directly to NVM memory 602.

In some embodiments, write-intensive user data that is read rarely, for example, the "many writers, one reader" user data 209, can have fast-write and slow-read access 605. The user data can first be written to NVM memory 602. Once most or all of the write operations are completed, the user data can be moved 608 to NAND flash memory 603. The user data can be read from either NVM memory 602 or NAND flash memory 603, depending on whether the user data has been moved to NAND flash memory 603.

According to embodiments, all the metadata can be stored in NVM memory 602 because the size of the metadata is typically substantially smaller than the user data.

By using hybrid SSD device 600, or a similar system, all the drawbacks and limitations related to the traditional methods, as explained above, can be reduced or eliminated. Also, the overhead associated with write amplification and garbage collection can also be reduced or eliminated. Thus, the overall SSD device performance and lifetime can be improved.

The methods described above in connection with hybrid SSD device 600 can also apply to other types of storage systems. NAND flash memory 603 can be replaced with a first NVM memory, which is not NAND flash memory, where the first NVM memory provides slower read/write access than NVM memory 602 (which can be referred to as a second NVM memory). For example, the first NVM memory can be PCM memory and the second NVM memory can be MRAM memory. As another example, NAND flash memory 603 can be replaced with a mechanical disk drive. According to embodiments, hybrid SSD device 600 can contain more than two memory types. For example, hybrid SSD device can contain three memory types, where the first memory type is MRAM, the second memory type is 3D XPoint, and the third type is NAND flash. MRAM can provide faster read/write access than 3D XPoint, which can provide faster read/write access than NAND flash. In other embodiments, the storage system can be a non-hybrid system with a single memory type. For example, in a non-hybrid storage device, NVM memory 602 can be replaced with a DRAM memory.

Figure 7:
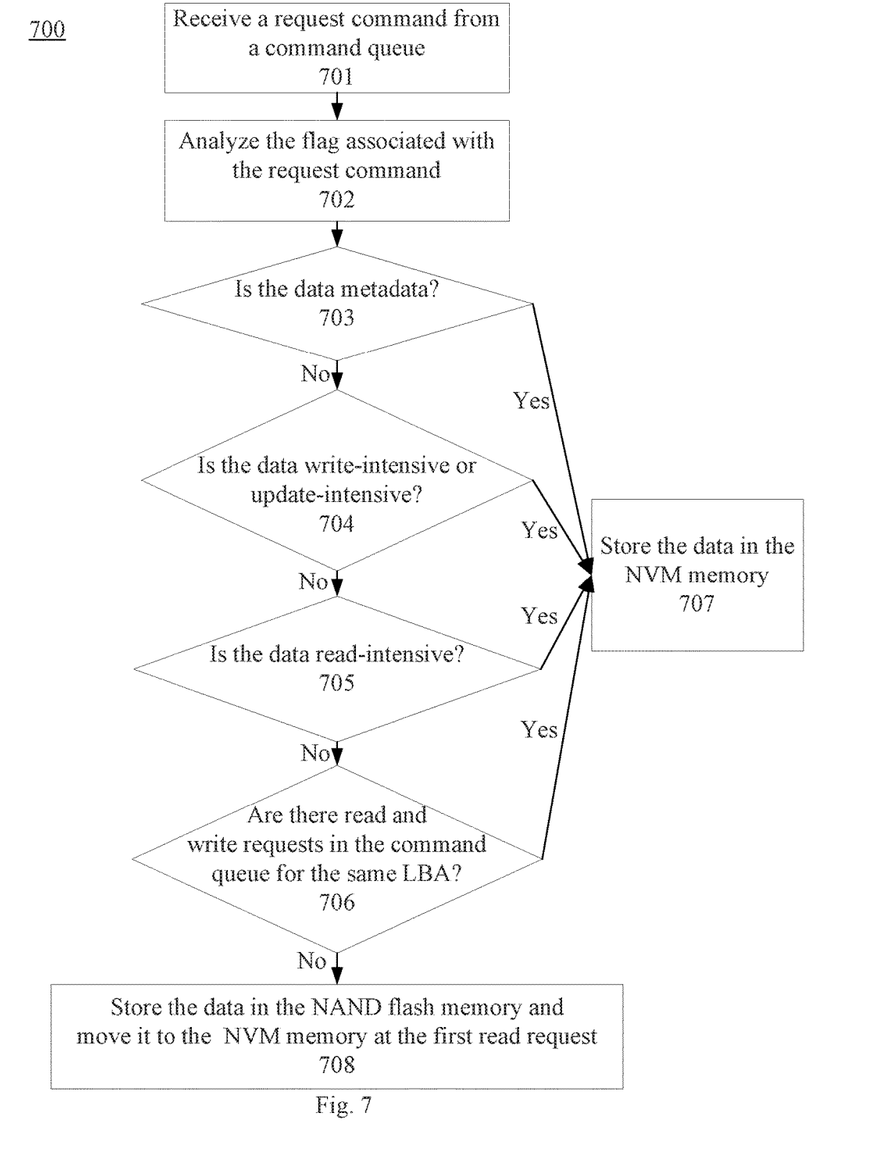
FIG. 7 illustrates an exemplary method for storing data in a hybrid SSD, in accordance with embodiments of the present disclosure.

FIG. 7 illustrates an exemplary method 700 for storing data in a hybrid SSD device, in accordance with embodiments of the present disclosure. Method 700 can include receiving a request command from a command queue (701). The request can be originated from the host and can be a write request. The flag associated with the request command can be analyzed (702). The flag can specify whether the data associated with the request command is metadata. If the data is metadata, the data can be stored in the NVM memory (703, 707). The flag can specify whether the data is write-intensive, update-intensive, or read-intensive. If the data is not metadata and if the data is write-intensive or update-intensive, the data can be stored in the NVM memory (703, 704, 707). If the data is not metadata and if the data is not write-intensive or update-intensive but is read-intensive, the data can be stored in the NVM memory (703, 704, 705, 707).

The command queue can be checked to determine whether there are other read and write requests for the same LBA as the LBA of the data associated with the write request command. If there are other read and write requests for the same LBA, the data can be stored in the NVM memory (706, 707). If there is no other read and write requests for the same LBA, the data can be stored in the NAND flash memory and moved to the NVM memory at the first read request (706, 708). According to embodiments, method 700 can be implemented in the SSD controller as hardware and/or software. In other embodiments, method 700 can be implemented outside the SSD controller.

The embodiments of the present disclosure were primarily discussed in connection with NAND flash memories. Those of skill in the art would appreciate, however, that the systems and methods disclosed herein are applicable to all memories that can utilize information about data associated with command requests, as well as to different types of storage comprising one or more memory types.

The embodiments of the present disclosure were primarily discussed in connection with making and processing write requests. Those of skill in the art would appreciate, however, that the systems and methods disclosed herein can be used or can be altered to be used in connection with making and processing read requests. For example, when data associated with read requests reside in NAND flash memory in a hybrid SSD system, the read-intensive flag and the update-intensive flag in FIG. 3 can be used to determine whether to copy or move the data to NVM memory. For instance, if a read request is sent with at least one of the read-intensive flag and update-intensive flag set to "1" and the data associated with the read request resides in NAND flash memory, then the data can be copied or moved to the NVM memory before receiving a write request. In another example, if data resides in NVM memory in a hybrid SSD system and read requests for the data stops being sent with the read-intensive flag set to "1," the data can be moved to the NAND flash memory.

Those of skill in the art would appreciate that the various illustrations in the specification and drawings described herein can be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware, software, or a combination depends upon the particular application and design constraints imposed on the overall system. Skilled artisans can implement the described functionality in varying ways for each particular application. Various components and blocks can be arranged differently (for example, arranged in a different order, or partitioned in a different way) all without departing from the scope of the subject technology.

Furthermore, an implementation of the communication protocol can be realized in a centralized fashion in one computer system, or in a distributed fashion where different elements are spread across several interconnected computer systems. Any kind of computer system, or other apparatus adapted for carrying out the methods described herein, is suited to perform the functions described herein.

A typical combination of hardware and software could be a general purpose computer system with a computer program that, when being loaded and executed, controls the computer system such that it carries out the methods described herein. The methods for the communications protocol can also be embedded in a non-transitory computer-readable medium or computer program product, which comprises all the features enabling the implementation of the methods described herein, and which, when loaded in a computer system is able to carry out these methods.

Computer program or application in the present context means any expression, in any language, code or notation, of a set of instructions intended to cause a system having an information processing capability to perform a particular function either directly or after either or both of the following a) conversion to another language, code or notation; b) reproduction in a different material form. Significantly, this communications protocol can be embodied in other specific forms without departing from the spirit or essential attributes thereof, and accordingly, reference should be had to the following claims, rather than to the foregoing specification, as indicating the scope of the invention.

The communications protocol has been described in detail with specific reference to these illustrated embodiments. It will be apparent, however, that various modifications and changes can be made within the spirit and scope of the disclosure as described in the foregoing specification, and such modifications and changes are to be considered equivalents and part of this disclosure.

The invention claimed is:

1. A method for writing data to a storage, the method comprising:
receiving, by a target device in communication with a host, a first write request from the host to write first data to the storage in communication with the target device;
determining, by a storage controller in the target device, a data type of the first data based on a first flag set corresponding to the first data; and storing in the storage, which is non-volatile, the first data to a location in the storage based at least on the data type of the first data wherein the first flag set comprises a first flag bit, a second flag bit, a third flag bit and a fourth flag bit, wherein the first flag bit indicates the data type of the first data, wherein the second flag bit indicates whether the first data is read intensive when the first data is forecast to receive a number of read requests over a threshold number, wherein the third flag bit indicates whether the first data is write-intensive when a number of file descriptors increases from an original amount, wherein the fourth flag bit indicates whether the first data is update intensive when the first data is forecast to receive a number of write requests over a second threshold number, and wherein the first data has an extents tree to classify data.

2. The method of claim 1, wherein storing the first data to a location comprises:
storing the first data to a first location in the storage when the data type of the first data corresponds to a first data type; and
storing the first data to a second location in the storage when the data type of the first data corresponds to a second data type.

3. The method of claim 2, wherein the first data type corresponds to user data and the second data type corresponds to metadata.

4. The method of claim 2, wherein the storage comprises a plurality of non-volatile memories and wherein the first location is in a first non-volatile memory (NVM) in the storage and the second location is in a second NVM in the storage.

5. The method of claim 4, wherein the first NVM comprises a NAND flash memory and the second NVM comprises at least one of a phase-change memory (PCM), a magnetoresistive RAM (MRAM) and a resistive RAM (RRAM or ReRAM).

6. The method of claim 1, wherein the first flag set comprises at least one flag bit and wherein the at least one flag bit indicates at least one characteristic of the first data based on information from a file system operating on the host.

7. The method of claim 6, wherein the storing the first data to a location in the storage is further based at least on a second flag bit of the first flag set, a third flag bit of the first flag set, and a fourth flag bit of the first flag set.

8. The method of claim 1, further comprising:
moving the first data to a second location in the storage; and
retrieving the first data from the second location in response to a first read request from the host.

9. The method of claim 8, wherein the second location in the storage is selected based at least on characteristics of the first data.

10. A system for writing data to a storage, the system comprising:
a target device in communication with a host configured to receive a first write request from the host to write first data to the storage, and comprising:
a storage controller configured to:
determine a data type of the first data based on a first flag set corresponding to the first data; and
store the first data to a location in the storage based at least on the data type of the first data; wherein the first flag set comprises a first flag bit, a second flag bit, a third flag bit and a fourth flag bit, wherein the first flag bit indicates the data type of the first data, wherein the second flag bit indicates whether the first data is read intensive when the first data is forecast to receive a number of read requests over a threshold number, wherein the third flag bit indicates whether the first data is write-intensive when a number of file descriptors increases from an original amount and wherein the fourth flag bit indicates whether the first data is update intensive when the first data is forecast to receive a number of write requests over a second threshold number.

11. The system of claim 10, wherein the storage controller is configured to store the first data to a location by:
storing the first data to a first location in the storage when the data type of the first data corresponds to a first data type; and
storing the first data to a second location in the storage when the data type of the first data corresponds to a second data type.

12. The system of claim 11, wherein the first data type corresponds to user data and the second data type corresponds to metadata.

13. The system of claim 11, wherein the storage comprises a plurality of non-volatile memories and wherein the first location is in a first non-volatile memory (NVM) in the storage and the second location is in a second NVM in the storage.

14. The system of claim 13, wherein the storage controller is further configured to store the first data to a location by storing the first data to a third location in the storage when the data type of the first data corresponds to a third data type, and wherein the third location is in a third NVM in the storage.

15. The system of claim 13, wherein the first NVM comprises a NAND flash memory and the second NVM comprises at least one of a phase-change memory (PCM), a magnetoresistive RAM (MRAM) and a resistive RAM (RRAM or ReRAM).

16. The system of claim 10, wherein the first flag set comprises at least one flag bit and wherein the at least one flag bit indicates at least one characteristic of the first data based on information from a file system operating on the host.

17. The system of claim 16, wherein the storing the first data to a location in the storage is further based at least on a second flag bit of the first flag set, a third flag bit of the first flag set, and a fourth flag bit of the first flag set.

18. The system of claim 10, wherein the target device is further configured to:
move the first data to a second location in the storage; and
retrieve the first data from the second location in response to a first read request from the host.

19. The system of claim 18, wherein the second location in the storage is selected based at least on characteristics of the first data.

* * * * *